United States Patent
Tseng et al.

(10) Patent No.: US 7,520,755 B2
(45) Date of Patent: Apr. 21, 2009

(54) METHOD OF FORMING SOLDER MASK AND WIRING BOARD WITH SOLDER MASK

(75) Inventors: Tzyy-Jang Tseng, Hsinchu (TW); Cheng-Po Yu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 349 days.

(21) Appl. No.: 11/307,425

(22) Filed: Feb. 7, 2006

(65) Prior Publication Data

US 2007/0099123 A1    May 3, 2007

(30) Foreign Application Priority Data

Oct. 31, 2005    (TW) .............. 94138042 A

(51) Int. Cl.
*H01R 12/00*    (2006.01)
(52) U.S. Cl. ...................................... 439/70
(58) Field of Classification Search .............. 330/270.1, 330/270.12, 311–312, 270.14; 439/74, 70; 361/774, 749–750; 257/718; 174/254–255, 174/261
See application file for complete search history.

(56) References Cited

U.S. PATENT DOCUMENTS 4,706,167 A * 11/1987 Sullivan ................ 361/774
4,966,827 A * 10/1990 Sullivan ................ 430/270.1
2005/0121778 A1* 6/2005 Liu et al. ................ 257/718

FOREIGN PATENT DOCUMENTS

| JP | S60201694 | 10/1985 |
| JP | 05-160556 | 6/1993 |
| JP | 08204316 | 8/1996 |
| JP | 2002299807 | 10/2002 |
| JP | 2004-319769 | 11/2004 |
| JP | 2004-323885 | 11/2004 |

* cited by examiner

*Primary Examiner*—Jean F Duverne
(74) *Attorney, Agent, or Firm*—Jianq Chyun IP Office

(57) ABSTRACT

A method of forming solder mask, suitable for forming a solder mask on the surface of a wiring board, is provided. The surface of the wiring board includes a first region and a second region, and the surface of the wiring board has a wiring pattern thereon. The method includes forming a first sub solder mask in the first region on the surface of the wiring board by performing a screen-printing or a photolithographic process, and forming a second sub solder mask in the second region on the surface of the wiring board by performing an ink-jet printing process. The method not only improves the precision of the solder mask alignment on the wiring board and its reliability, but also increases the production rate and lowers the manufacturing cost.

11 Claims, 8 Drawing Sheets

METHOD OF FORMING SOLDER MASK AND WIRING BOARD WITH SOLDER MASK

CROSS-REFERENCE TO RELATED APPLICATION

This application claims the priority benefit of Taiwan application serial no. 94138042, filed on Oct. 31, 2005. All disclosure of the Taiwan application is incorporated herein by reference.

BACKGROUND OF THE INVENTION

1. Field of the Invention

The present invention relates to a method of forming a solder mask. More particularly, the present invention relates to a method of forming a solder mask on a wiring board.

2. Description of the Related Art

With the rapid development of digital electronic technologies, printed wiring boards are found widely used in digital electronic products. Electronic products, such as mobile phones, computers, and digital cameras etc., are fabricated with a printed wiring board. In other words, wiring boards are used for almost all of the electronic devices. According to the fabricating method, wiring boards can be divided into two major types: a lamination method and a build-up method. In general, the lamination method is applied to produce a Printed Wiring Board (PWB) which has a lower wiring density. On the other hand, the build-up method is applied to produce a package substrate with a higher wiring density. However, with the current trend for wiring boards with higher wiring density, regardless whether it is a PWB or a package substrate, the design of the PWB and the package substrate should meet the demand of high wiring density and small line width.

As described, a wiring board is to provide a support for the external electronic devices and a medium for transferring currents between them. Therefore, in the fabrication of a wiring board, wirings of the external electronic device assembling areas must be defined and a layer of high molecular weight material must cover the non-assembling areas to serve as a protection for the wiring board. The protective high molecular weight material layer is often referred to as the solder mask. Conventionally, the coating process for forming a solder mask on the wiring board includes spraying a layer of photosensitive ink on the surface of the printed wiring board; the photosensitive ink layer is exposed and developed to produce a patterned solder mask.

FIG. 1A is a top view of a conventional wiring board having a solder mask thereon. FIG. 1B is a cross-sectional view along line A-A' of FIG. 1A. The wiring board 100 shown in FIGS. 1A and 1B includes a base layer 110, a wiring pattern 120 and a solder mask 130. The base layer 110 is, for example, a single insulating layer or a plurality of patterned conductive layers and at least one insulating layer alternately stacked over each other. The wiring pattern 120 on the surface of the base layer 110 includes a plurality of pads 122 and a plurality of conductive traces 124. The pads 122 are exposed by the openings 130a of the solder mask 130 and used for carrying and connecting with other external electronic devices such as capacitors or diodes. The conductive traces 124 are connected to the pads 122 for transmitting current signals. In addition, the solder mask 130 also covers the other portion of the conductive traces 124 that are not connected with external devices (the areas marked with dashed lines in FIG. 1A) so as to provide some protection.

Using the Non-Solder Mask Defined (NSMD) pad as an example, there is a gap d1 between the pad 122 of the wiring pattern 120 and the opening 130a. In the process of forming the solder mask 130, the size of the gap d1 is mainly determined by the precision of alignment of the coating machine. In general, if the screen-printing method is used to fabricate the solder mask 130, because of lower alignment accuracy, the gap d1 must be larger to prevent any solder mask 130 from directly covering the pad 122 and reducing the exposed surface of the pad 122. On the other hand, if the photolithographic process, which has higher alignment accuracy, is used to fabricate the solder mask 130, a gap d1 can be smaller than the one produced by the screen-printing method. Thus, the wiring density in the wiring board 100 can be increased.

With the demand for a higher wiring density in the wiring board 100, the gap d1 in between the pad 122 and the opening 130a of the solder mask 130 has to be reduced so that more wiring patterns 120 can be accommodated within the same area. Therefore, photolithographic process is more frequently selected as the means for forming the solder mask 130 due to the demand for a higher precision in the alignment.

With the upcoming trend for producing larger wiring boards 100, even the photolithographic method of forming the solder mask 130, which can produce a smaller gap d1, needs a plurality of trail substrates to obtain an accurate alignment due to the expansion and contraction of the wiring board. Alternatively, a glass substrate or separate exposure method is used to resolve this problem. However, the aforesaid method not only complicate the process of forming the solder mask 130, but also considerably increases the production cost. Although an ink-jet printing process can compensate for the expansion and contraction to produce a highly aligned solder mask 130 with a relatively small gap d1, the need for coating a large wiring board 100 often leads to a slowdown of the fabrication process. Consequently, the increase of production cost makes the ink-jet printing technique not suitable for mass-producing wiring boards 100 with high wiring density.

SUMMARY OF THE INVENTION

An objective of the present invention is to provide a method of forming a solder mask capable of reducing the time needed to fabricate the solder mask on a high wiring density wiring board.

Another objective of the present invention is to provide a high wiring density wiring board having a solder mask that shortens the fabrication time.

To achieve these and other advantages and in accordance with the purpose of the invention, as embodied and broadly described herein, the invention provides a method of forming a solder mask suitable for forming a solder mask on a surface of a base layer of a wiring board. A surface of the wiring board includes a first region and a second region, and a wiring pattern is disposed on the surface of the wiring. The method includes forming a first sub solder mask in the first region on the surface of the wiring board by performing a screen-printing or a photolithographic process. Then, a second sub solder mask is formed in the second region on the surface of the wiring board by performing an ink-jet printing process.

According to one preferred embodiment of the present invention, the step of forming the second sub solder mask further includes depositing in such a way that the second sub solder mask and the already formed first sub solder mask partially overlap in the junction between the first region and the second region.

According to one preferred embodiment of the present invention, the step of forming the first sub solder mask further includes depositing in such a way that the first sub solder mask and the already formed second sub solder mask partially overlap in the junction between the first area and the second area.

The present invention also provide a wiring board with a solder mask thereon. The wiring board comprises at least a base layer with a surface, a wiring pattern disposed on the surface of the base layer, a first sub solder mask and a second sub solder mask. The surface of the base layer includes a first region and a second region. The first sub solder mask is disposed in the first region on the surface of the base layer. The second sub solder mask and the first sub solder mask partially overlap in the junction between the first region and the second region.

According to one preferred embodiment of the present invention, the wiring pattern disposed in the first region has a wiring density smaller than the wiring pattern disposed in the second region.

According to one preferred embodiment of the present invention, the first sub solder mask covers the wiring pattern in the first region and the second sub solder mask exposes the wiring pattern in the second region.

According to one preferred embodiment of the present invention, the first sub solder mask has a thickness greater than the second sub solder mask or the first sub solder mask has a thickness smaller than the second sub solder mask.

In brief, the present invention utilizes a screen-printing or photolithographic process together with an ink-jet printing process to fabricate a solder mask on a wiring board with a shorter production time and a higher alignment precision and reliability. Hence, the method is suitable for mass-producing wiring boards with a high wiring density so that the productivity is increased and the production cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
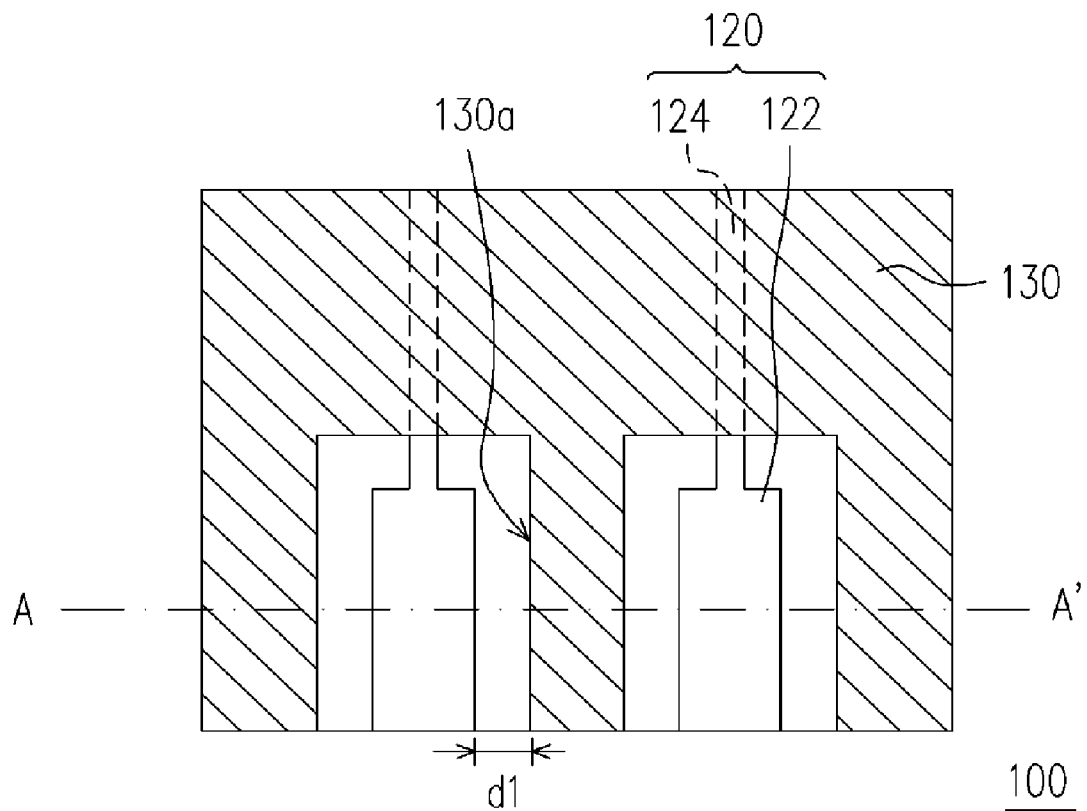
FIG. 1A is a top view of a conventional wiring board having a solder mask thereon.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 2A:
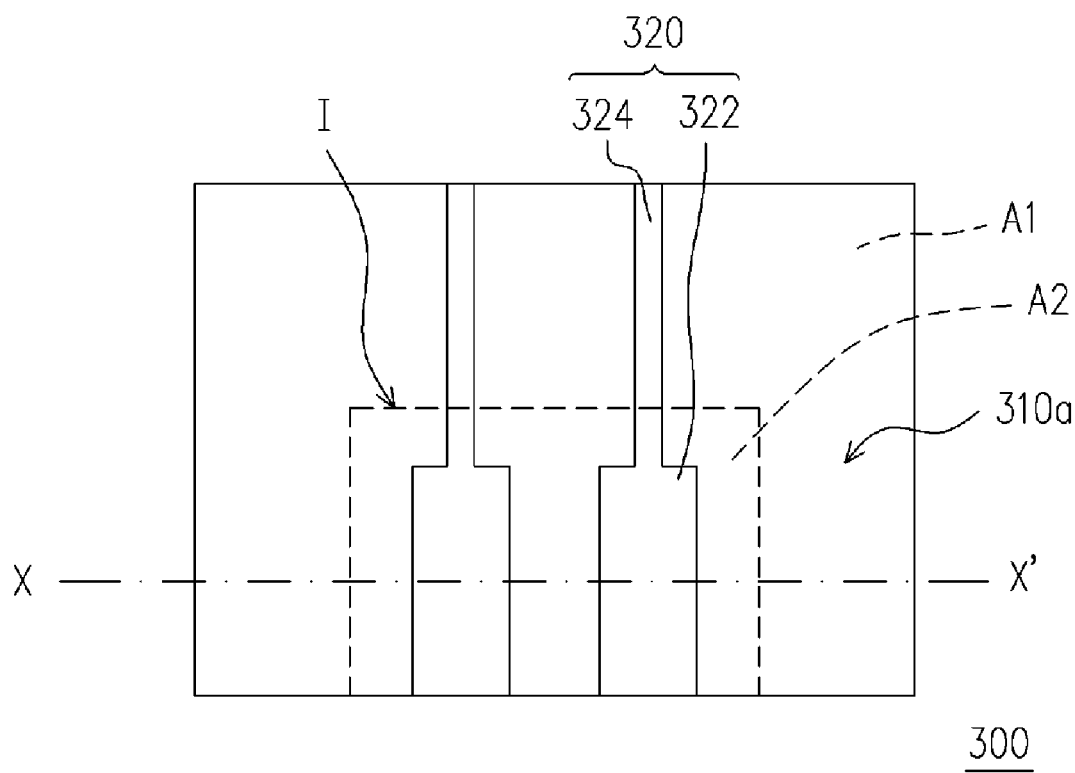
FIGS. 2A, 3A and 4A are top views showing a method of forming a solder mask according to the first embodiment of the present invention.
Figure 2B:
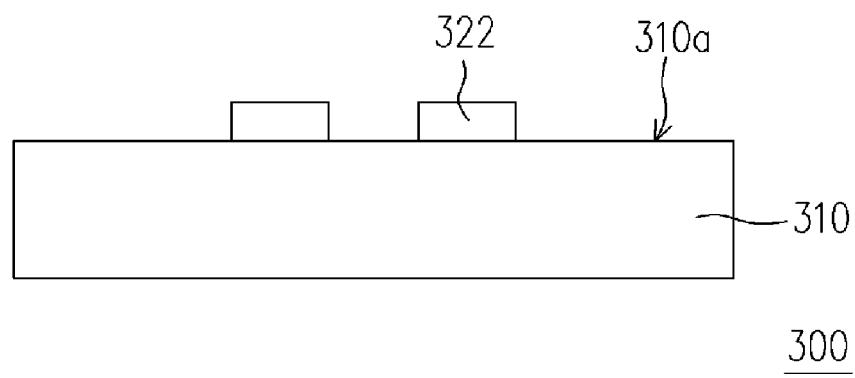
FIG. 2B is a cross-sectional view along line X-X' of FIG. 2A.
Figure 3A:
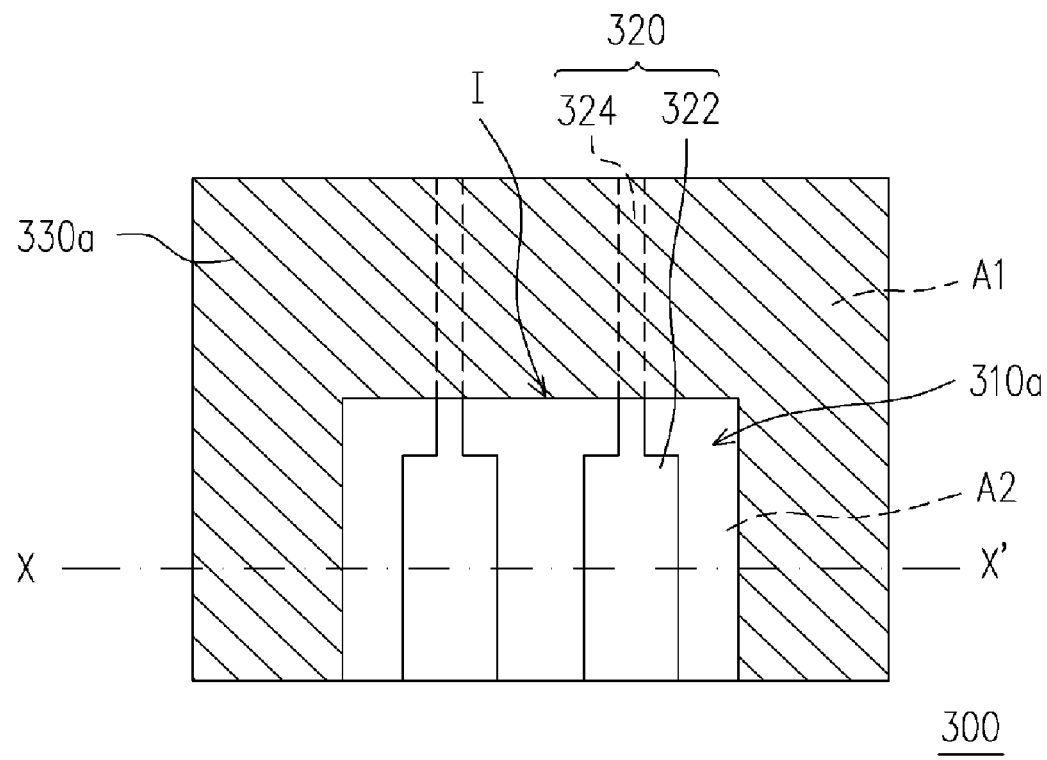
Figure 3B:
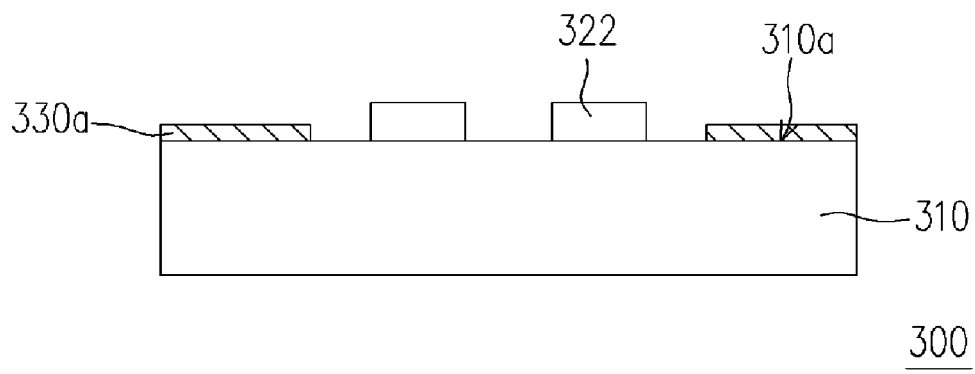
FIG. 3B is a cross-sectional view along line X-X' of FIG. 3A.
Figure 4A:
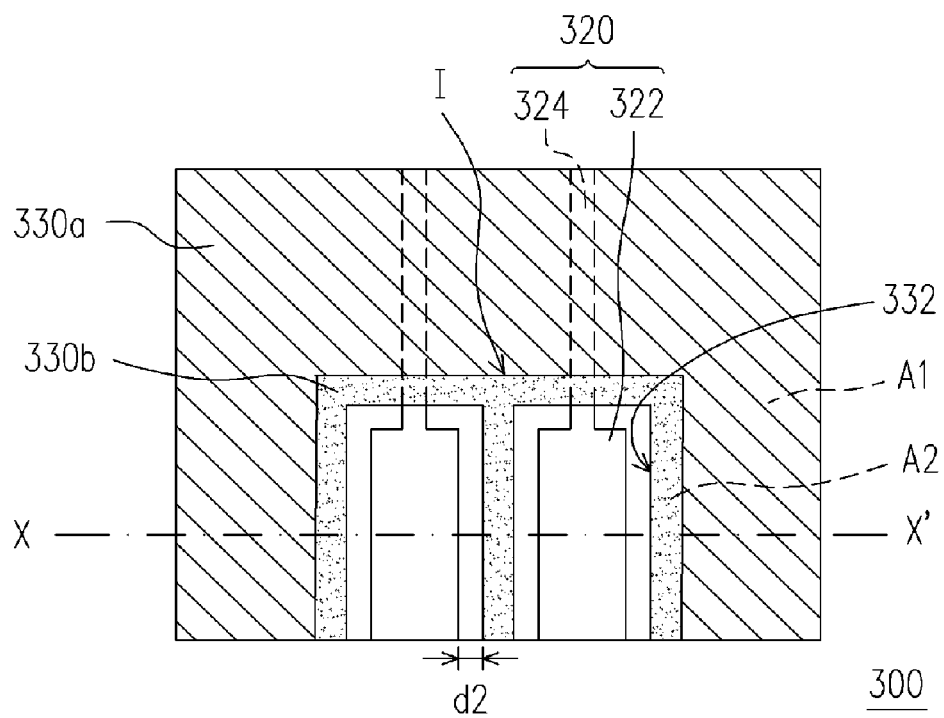
Figure 4B:
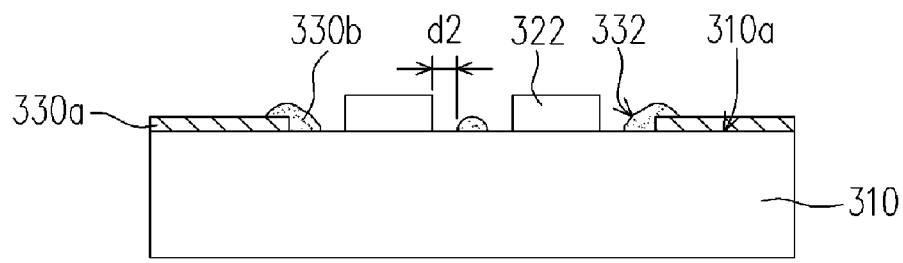
FIG. 4B is a cross-sectional view along line X-X' of FIG. 4A.

In the following, an embodiment is described to illustrate the process of forming a solder mask over a wiring board. FIGS. 2A, 3A and 4A are top views showing a method of forming a solder mask according to a first embodiment of the present invention. FIG. 2B is a cross-sectional view along line X-X' of FIG. 2A. FIG. 3B is a cross-sectional view along line X-X' of FIG. 3A. FIG. 4B is a cross-sectional view along line X-X' of FIG. 4A. In FIGS. 2A and 2B, the wiring board 300 includes a base layer 310 and a wiring pattern 320 disposed on a surface 310a of the base layer 310. The base layer 310 is, for example, a single insulating layer or comprises a plurality of patterned conductive layers and at least an insulation layer alternately stacked over each other. The wiring pattern 320 includes a plurality of pads 322 and a plurality of conductive traces 324. The pads 322 are used for supporting and providing a means of conduction with external electronic devices and the conductive traces 324 are used for transmitting signaling current.

In FIG. 2A, the dash lines divides the surface 310a of the base layer 310 into a first region A1 and a second region A2. In other words, the first region A1 and the second region A2 on the surface 310a of the base layer 310 exist at a junction I marked by the dash line. In a first embodiment, the wiring density in the second region A2 is higher with respect to the wiring density in the first region A1. The pads 322 in the wiring pattern 320 are located in the second region A2 where the wiring density is higher.

As shown in FIGS. 3A and 3B, a first sub solder mask 330a is formed on the surface 310a of the base layer 310 in the first region A1 by performing a screen-printing process, and the first sub solder mask 330a covers a portion of the wiring pattern 320 in the first region A1. Because the first region A1 on the surface 310a of the wiring board 300 has a lower wiring density, a layer of ink can be coated on the first region A1 by the screen-printing method to form the first sub solder mask 330. At this stage, the second region A2 on the surface 310a with a higher wiring density still does not have any solder mask material formed or deposited thereon.

Figure 1B:
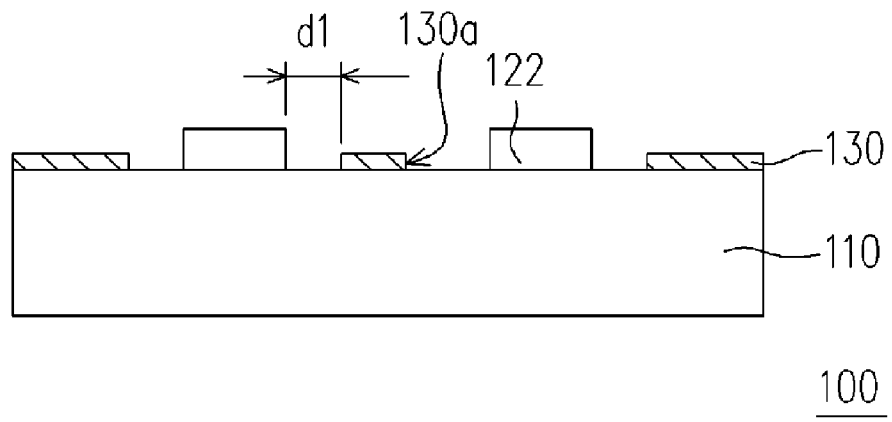
FIG. 1B is a cross-sectional view along line A-A' of FIG. 1A.

As shown in FIGS. 4A and 4B, after forming the first sub solder mask 330a through a screen-printing process, an ink-jet printing method is used to form a second sub solder mask 330b on the surface 310a of the base layer 310 in the second region A2. Furthermore, the openings 332 in the second sub solder mask 330b also expose the pads 322 (portions) of the wiring pattern 320 respectively. Because the surface 310a in the second region A2 has a higher wiring density, a more accurate alignment is required when forming the solder mask over the second region A2. Therefore, the ink-jet printing method, which has a higher precision, is used to form the second sub solder mask 330b over the second region A2. Since the ink-jet printing method of forming a solder mask over a wiring board 300 has a higher alignment precision compared with the screen-printing or the photolithographic process, the gap d2 between the second sub solder mask 330b and the pad 322 of the wiring pattern 320 is smaller than the gap d1 produced by the conventional technique (as shown in FIGS. 1A and 1B). Up to this stage, the steps required to fabricate a solder mask comprising a first sub solder mask 330a and a second sub solder mask 330b on the base layer 310 of the wiring board 300 is completed.

It should be noted that the second sub solder mask 330b is formed in such a way that it partially overlap the already formed first sub solder mask 330a at the junction I between the first region A1 and the second region A2 as shown in FIG. 4B. This ensures that there is no gap at the junction I between the first sub solder mask 330a in the first region A1 and the second sub solder mask 330b in the second region A2.

Figure 5:
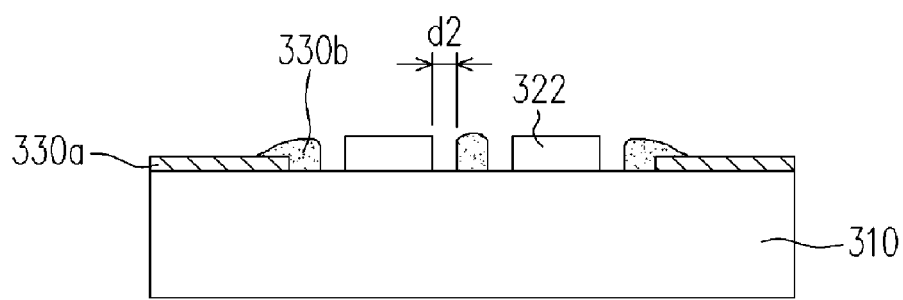
FIG. 5 is a cross-sectional view showing the second sub solder mask in FIG. 4A having a thickness greater than the first sub solder mask.

As shown in FIG. 4B, the thickness of the second sub solder mask 330b is set to a value smaller than the thickness of the first sub solder mask 330a. However, this embodiment by no means limits the thickness of the second sub solder mask 330b as such. FIG. 5 is a cross-sectional view showing the second sub solder mask in FIG. 4A having a thickness greater than the first sub solder mask. As shown in FIG. 5, the ink-jet printing process produces a second sub solder mask 330b having a thickness greater than the first sub solder mask 330a. Furthermore, the second sub solder mask 330b also overlaps the already formed first sub solder mask 330a at the junction I between the first region A1 and the second region A2. This ensures that there is no gap in the junction I between the first sub solder mask 330a and the second sub solder mask 330b.

Second Embodiment

Figure 6A:
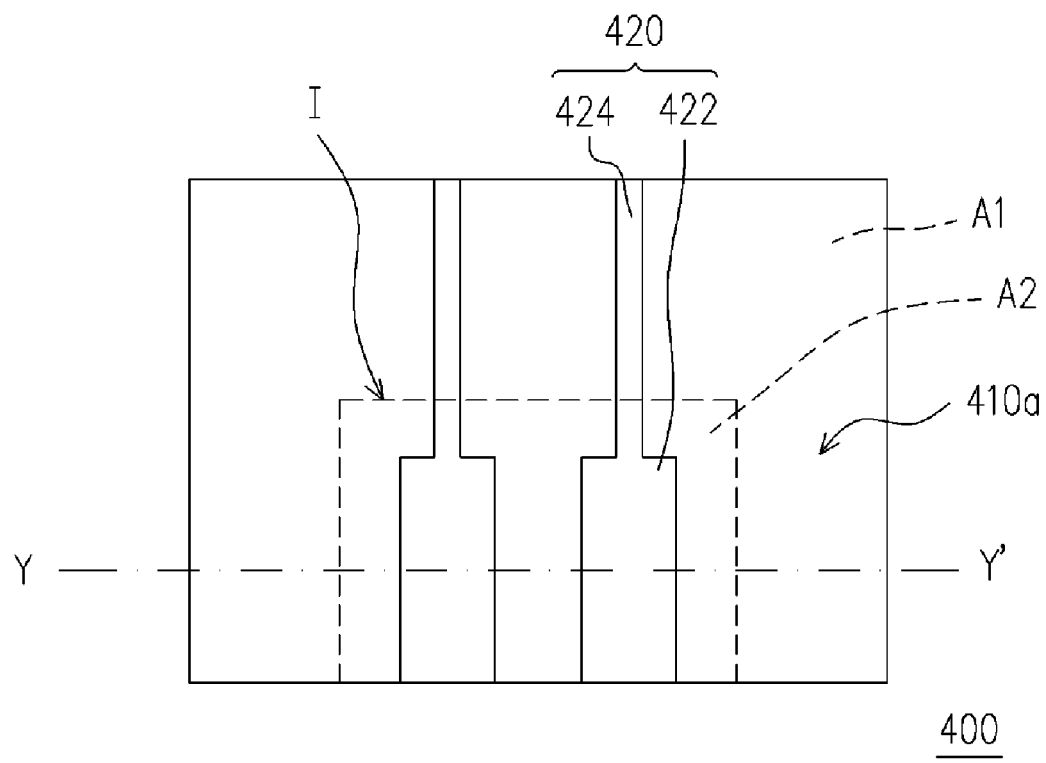
FIGS. 6A, 7A, 8A and 9A are top views showing a method of forming a sub solder mask according to the second embodiment of the present invention.
Figure 6B:
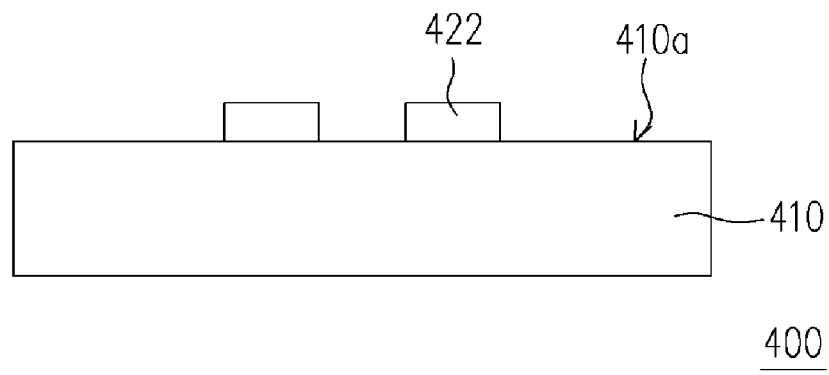
FIG. 6B is a cross-sectional view along line Y-Y' of FIG. 6A.

In the following, another embodiment is used to explain the process of forming a solder mask over a wiring board. FIGS. 6A, 7A, 8A and 9A are top views showing a method of forming a sub solder mask according to a second embodiment of the present invention. FIG. 6B is a cross-sectional view along line Y-Y' of FIG. 6A. FIG. 7B is a cross-sectional view along line Y-Y' of FIG. 7A. FIG. 8B is a cross-sectional view along line Y-Y' of FIG. 8A. FIG. 9B is a cross-sectional view along line Y-Y' of FIG. 9A. As shown in FIGS. 6A and 6B, the wiring board 400 has a structure similar to the wiring board 300 in FIG. 2A. The wiring board 400 includes a base layer 410 and a wiring pattern 420 disposed on the surface 410a of the base layer 410. Since the process of patterning the base layer 410 is identical to the process used in the first embodiment, a detailed description is omitted. The wiring pattern 420 includes a plurality of pads 422 and a plurality of conductive traces 424. In the second embodiment, the junction I indicated by dash line in FIG. 6A divides the surface 410a of the base layer 410 into a first region A1 with a lower wiring density and a second region A2 with a higher wiring density. The pads 422 of the wiring pattern 420 are located in the second region A2, which has a higher wiring density.

Figure 7A:
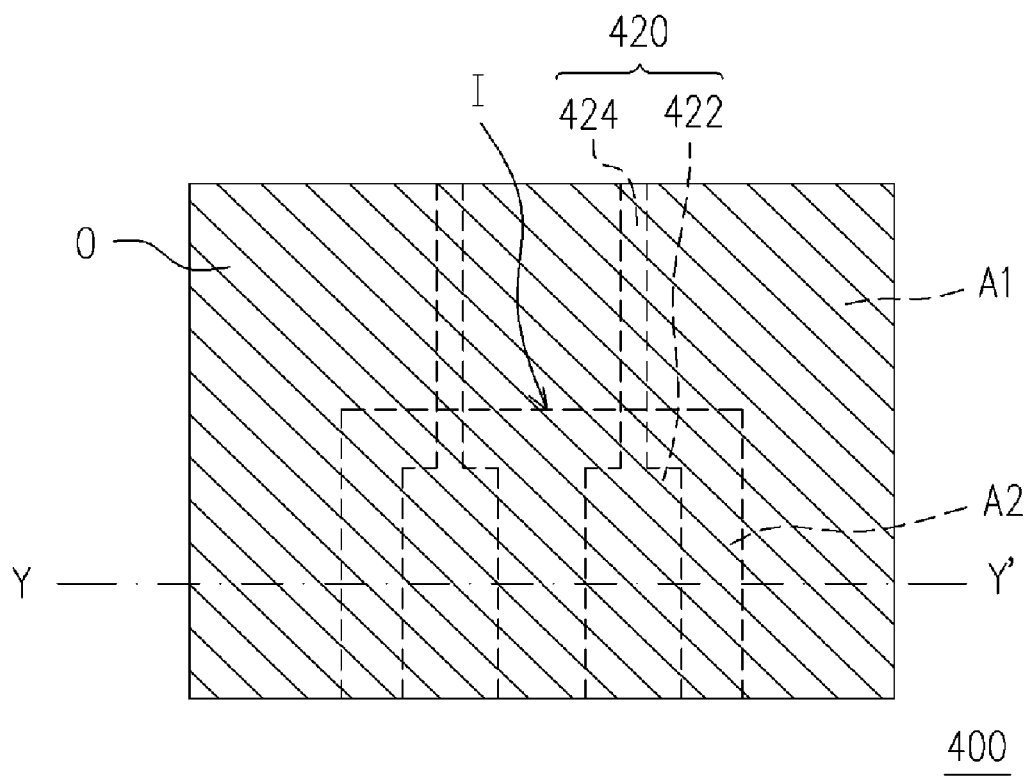
Figure 7B:
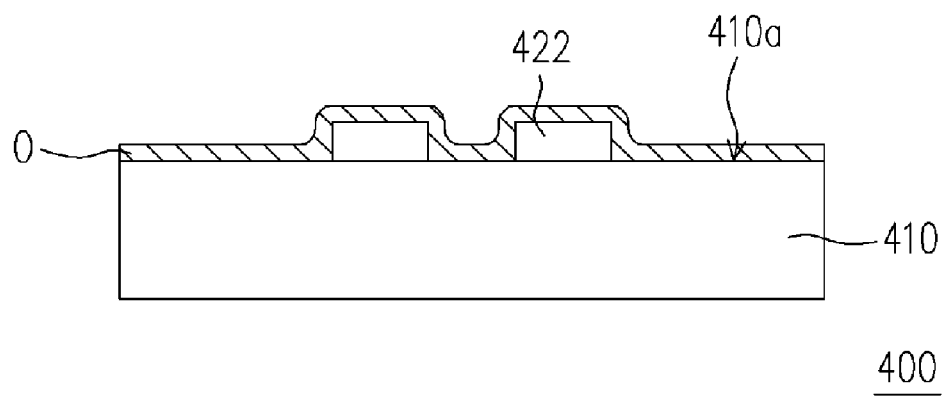
FIG. 7B is a cross-sectional view along line Y-Y' of FIG. 7A.

As shown in FIGS. 7A and 7B, a photosensitive ink layer O is globally deposited over the surface 410a (including both the first region A1 and the second region A2) of the base layer 410 to cover the whole wiring pattern 420.

Figure 8A:
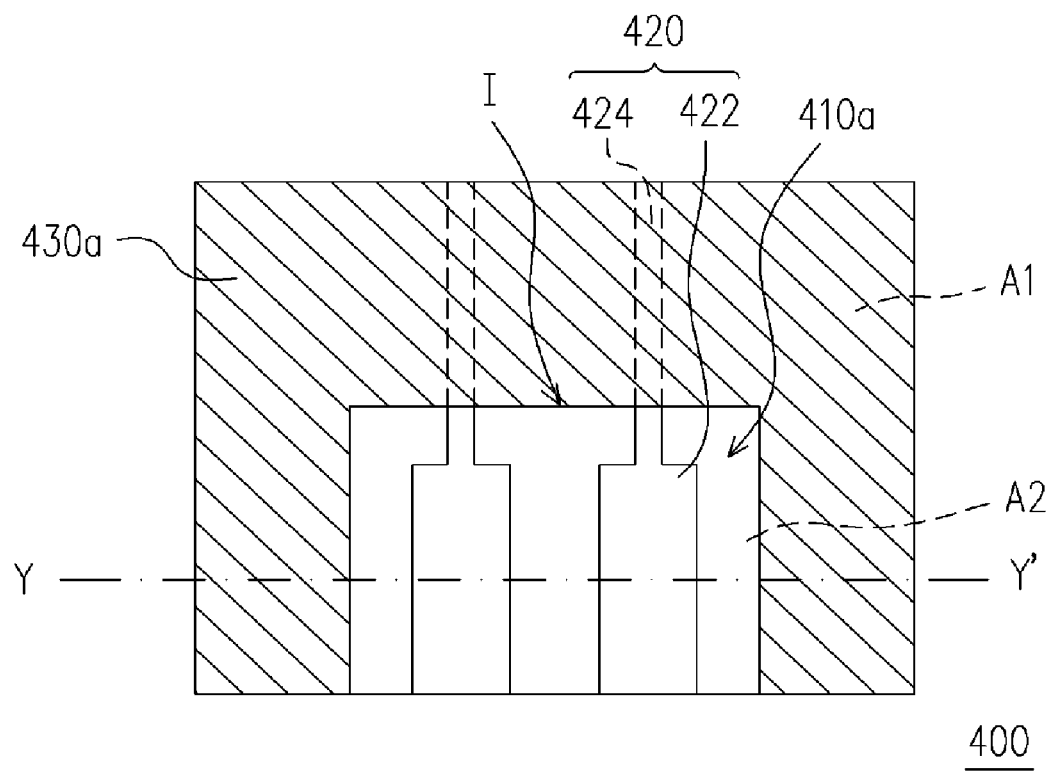
Figure 8B:
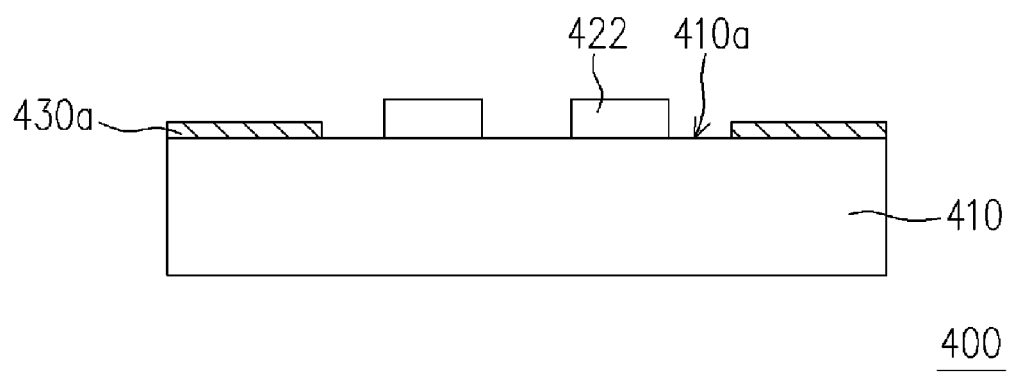
FIG. 8B is a cross-sectional view along line Y-Y' of FIG. 8A.

As shown in FIGS. 8A and 8B, after forming a photosensitive ink layer O over the surface 410a of the base layer 410 (as shown in FIGS. 7A and 7B), the photosensitive ink layer O is exposed and developed to form a first sub solder mask 430a, which covers a portion of the wiring pattern 420 in the first region A1. In the second embodiment, the first sub solder mask 430a has a pattern profile that matches the first region A1 and exposes the second region A2. Hence, after performing a photo-exposure and a development process on the photosensitive ink layer O shown in FIGS. 7A and 7B, the first sub solder mask 430a shown in FIGS. 8A and 8B is formed.

Figure 9A:
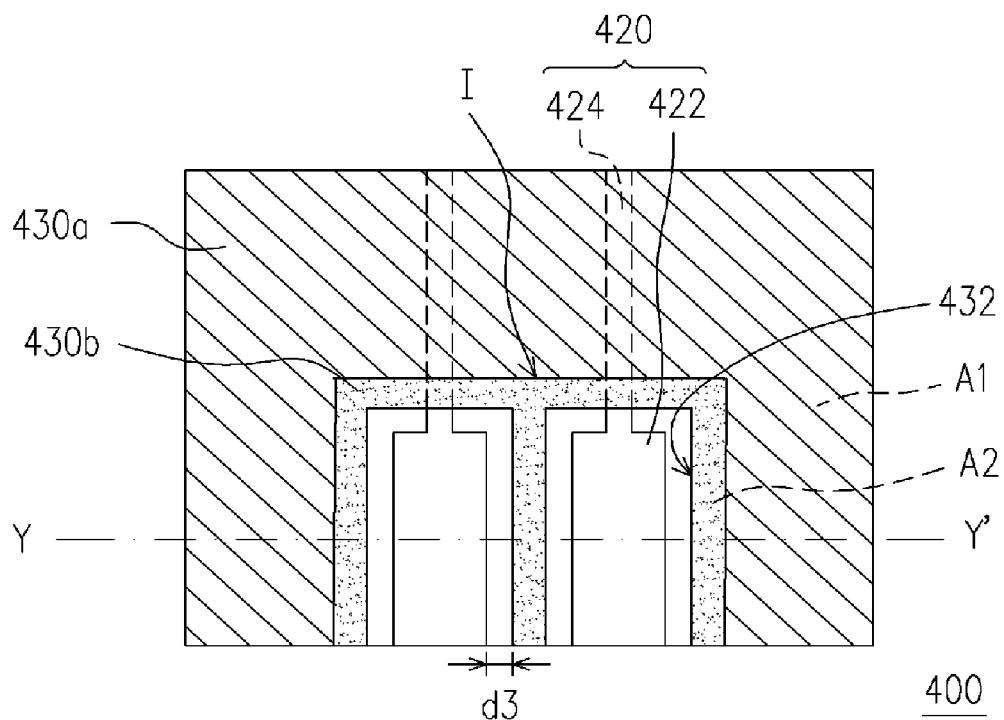
Figure 9B:
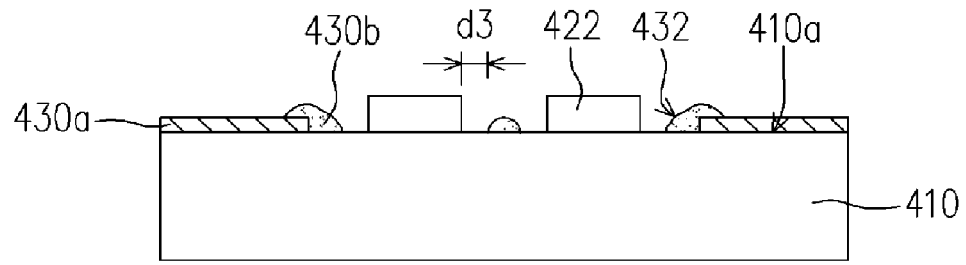
FIG. 9B is a cross-sectional view along line Y-Y' of FIG. 9A.

As shown in FIGS. 9A and 9B, after forming the patterned first sub solder mask 430a in a photolithographic process, an ink-jet printing process is performed to form a second sub solder mask 430b on the surface 410a of the base layer 410 in the second region A2. The openings 432 in the second sub solder mask 430b expose the pads 422 (portions) of the wiring pattern 420 respectively. Similarly, as in the first embodiment, the process of forming of a solder mask over the second region A2 demands a higher alignment precision because the wiring density on the surface 410a of the wiring board 400 in the second region A2 is higher. Therefore, the ink-jet printing process, which can provide a higher alignment precision, is the appropriate method for forming the second sub solder mask 430b over the second region A2. Since the ink-jet printing process has a higher alignment precision than either the screen-printing process or the photolithographic process, the gap d3 between the second solder mask 430b and the pad 422 of the wiring pattern 420 is smaller than the gap d1 produced by the conventional technique (as shown in FIGS. 1A and 1B). Up to this stage, the steps required to fabricate a solder mask comprising a first sub solder mask 430a and a second sub solder mask 430b on the base layer 410 of the wiring board 400 is completed.

Similarly, as in the first embodiment, the second sub solder mask 430b is formed in such a way that it partially overlaps the already formed first sub solder mask 430a at the junction I between the first region A1 and the second region A2 as shown in FIG. 9B to ensure that there is no gap at the junction I between the first sub solder mask 430a in the first region A1 and the second sub solder mask 430b in the second region A2.

Figure 10:
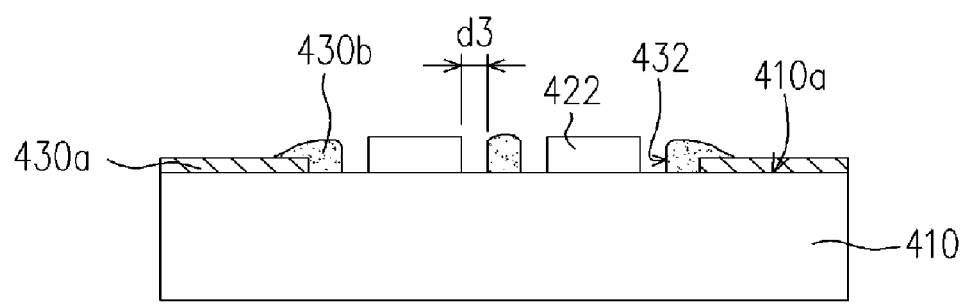
FIG. 10 is a cross-sectional view showing the second sub solder mask in FIG. 9A having a thickness greater than the first sub solder mask.

As shown in FIG. 9B, the thickness of the second sub solder mask 430b is set to a value smaller than the thickness of the first sub solder mask 430a. However, this embodiment by no means limits the thickness of the second sub solder mask 430b as such. FIG. 10 is a cross-sectional view showing the second sub solder mask in FIG. 9A having a thickness greater than the first sub solder mask. As shown in FIG. 10, the ink-jet printing process produces a second sub solder mask 430b having a thickness greater than the first sub solder mask 430a. Furthermore, the second sub solder mask 430b also partially overlaps the already formed first sub solder mask 430a at the junction I between the first region A1 and the second region A2.

In the two aforementioned embodiments, the first sub solder mask is formed on the base layer of the wiring board before forming the second sub solder mask. Obviously, this should by no means limit the scope of the present invention. In the process of forming the solder mask, the second sub solder mask can be formed before the first sub solder mask. To ensure a tight engagement between the first sub solder mask and the second sub solder mask at the junction, the first sub solder mask is formed to overlap partially the already formed second sub solder mask at the junction between the first region and the second region. In addition, the thickness of the first sub solder mask can be greater than or smaller than the thickness of the second sub solder mask. Here, a detailed description with drawings is not repeated.

In summary, the advantages of the present invention includes:

1. The ink-jet printing process is used to form the solder mask over the region in the wiring board having a high wiring density. Hence, the gap between the wiring pattern of the wiring board and the solder mask is reduced. As a result, the present invention is suitable for forming a solder mask layer on a wiring board with a high wiring density to increase reliability.

2. Because the screen-printing process or photolithographic process is used together with the ink-jet printing process to form solder masks on a wiring board, the present invention can increase the speed of forming a solder mask over a wiring board with a high wiring density. Ultimately, the productivity of wiring board is increased and overall production cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming solder mask, suitable for forming a solder mask on a surface of a base layer on a wiring board, wherein the surface includes a first region and a second region and the wiring board has a wiring pattern on the surface, the method comprising the steps of:
    forming a first sub solder mask on the surface of the base layer in the first region to cover the wiring pattern in the first region by performing a screen-printing process; and
    forming a second sub solder mask on the surface of the base layer in the second region by performing an ink-jet printing process.

2. The method of claim 1, wherein the second sub solder mask is formed in a way that it partially overlaps with the already formed first sub solder mask at a junction between the first region and the second region.

3. The method of claim 1, wherein the first sub solder mask is formed in a way that it partially overlaps with the already formed second sub solder mask at a junction between the first region and the second region.

4. A method for forming solder mask, suitable for forming a solder mask on a surface of a base layer on a wiring board, wherein the surface includes a first region and a second region and the wiring board has a wiring pattern on the surface, the method comprising the steps of:
    forming a first sub solder mask on the surface of the base layer in the first region to cover the wiring pattern in the first region by performing a depositing process and then a photolithographic process; and
    forming a second sub solder mask on the surface of the base layer in the second region by performing an ink-jet printing process.

5. The method of claim 4, wherein the second sub solder mask is formed in a way that it partially overlaps with the already formed first sub solder mask at a junction between the first region and the second region.

6. The method of claim 4, wherein the first sub solder mask is formed in a way that it partially overlaps with the already formed second sub solder mask at a junction between the first region and the second region.

7. A wiring board having a solder mask formed thereon, comprising:
    a base layer having a surface divided into a first region and a second region;
    a wiring pattern disposed on the surface of the base layer, wherein the wiring pattern within the first region has a wiring density smaller than that of the wiring pattern within the second region;
    a first sub solder mask disposed on the surface of the base layer in the first pg,17 region; and
    a second sub solder mask disposed on the surface of the base layer in the second region, and the second sub solder mask is only overlapped with the first sub solder mask at a junction between the first region and the second region.

8. The wiring board of claim 7, wherein the first sub solder mask covers a portion of the wiring pattern in the first region.

9. The wiring board of claim 7, wherein the second sub solder mask exposes a portion of the wiring pattern in the second region.

10. The wiring board of claim 7, wherein the first sub solder mask has a thickness greater than that of the second sub solder mask.

11. The wiring board of claim 7, wherein the first sub solder mask has a thickness smaller than that of the second sub solder mask.

* * * * *